(12) United States Patent
Dai

(10) Patent No.: US 9,786,242 B2
(45) Date of Patent: Oct. 10, 2017

(54) GATE DRIVER ON ARRAY CIRCUIT AND DISPLAY USING THE SAME

(71) Applicant: WUHAN CHINA STAR OPTOELECTRONICS TECHNOLOGY CO., LTD., Wuhan, Hubei (CN)

(72) Inventor: Ronglei Dai, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 96 days.

(21) Appl. No.: 14/907,544

(22) PCT Filed: Jan. 12, 2016

(86) PCT No.: PCT/CN2016/070626
§ 371 (c)(1),
(2) Date: Jan. 25, 2016

(87) PCT Pub. No.: WO2017/113438
PCT Pub. Date: Jul. 6, 2017

(65) Prior Publication Data
US 2017/0236480 A1    Aug. 17, 2017

(30) Foreign Application Priority Data
Dec. 29, 2015 (CN) .......................... 2015 1 1017239

(51) Int. Cl.
G09G 3/36 (2006.01)
(52) U.S. Cl.
CPC ......... *G09G 3/3677* (2013.01); *G09G 3/3688* (2013.01); *G09G 2300/0408* (2013.01); *G09G 2310/0289* (2013.01); *G09G 2310/08* (2013.01); *G09G 2330/021* (2013.01)

(58) Field of Classification Search
CPC ... G09G 2310/0286; G09G 2310/0267; G09G 3/3674; G09G 2310/0289; G09G 3/3266; G09G 3/3688; G09G 2310/08; G09G 2330/021
USPC .................................. 345/204, 690, 98–100
See application file for complete search history.

(56) References Cited

U.S. PATENT DOCUMENTS

| | | | | |
|---|---|---|---|---|
| 7,953,201 | B2* | 5/2011 | Tsai ....................... | G11C 19/28 377/64 |
| 8,565,370 | B2* | 10/2013 | Lee ....................... | G09G 3/3677 377/64 |
| 8,686,979 | B2* | 4/2014 | Park ..................... | G09G 3/3674 345/204 |
| 8,687,761 | B2* | 4/2014 | Hsu ...................... | G09G 3/3677 377/64 |

(Continued)

*Primary Examiner* — Duc Dinh
(74) *Attorney, Agent, or Firm* — Kirton McConkie; Evan R. Witt

(57) ABSTRACT

A GOA circuit includes GOA circuit units. The GOA circuit units at every two stages share a pull-down circuit. The pull-down circuit includes a first transistor, a second transistor and a third transistor. The present invention uses fewer transistors for the GOA circuit and lower the frequency of the first and second clock signals. The decrease in the frequency of the first and second clock signals helps a decrease in the frequency of charge and discharge to the parasitic capacitance and further a reduction in overall power consumption of the GOA circuit.

16 Claims, 3 Drawing Sheets

(56) References Cited

U.S. PATENT DOCUMENTS 8,792,609 B2 * 7/2014 Ahn ................ G11C 19/28
377/64
8,890,790 B2 * 11/2014 Lin ................ G09G 3/3688
345/100

* cited by examiner

GATE DRIVER ON ARRAY CIRCUIT AND DISPLAY USING THE SAME

BACKGROUND OF THE INVENTION

1. Field of the Invention

The present invention relates to a display, and more particularly, to a display using a gate driver on array (GOA) circuit.

2. Description of the Prior Art

A gate driver is disposed on a substrate comprising a thin film transistor (TFT) array in the process of a thin film transistor liquid crystal display (TFT-LCD) array for performing row-by-row scanning This is what a GOA circuit is.

The GOA circuit comprises a plurality of GOA circuit units. Each of the plurality of GOA circuit units are fabricated from a plurality of transistors and a plurality of capacitors. A GOA circuit is formed on one lateral side of the glass substrate directly. So, the fewer the transistors and capacitors forming each of the plurality of GOA circuit units are, the more the unoccupied room of the glass substrate for the GOA circuit is. Moreover, the parasitic capacitance is charged and discharged by each of the plurality of GOA circuit units whenever signals switch. A clock signal with a higher frequency affects the power produced by the parasitic capacitance to a larger scale. Especially, a clock signal for a pull-down module affects the power produced by the parasitic capacitance obviously.

Therefore, the IT industry strives to create a GOA circuit comprising a GOA circuit unit comprising fewer transistors and reducing power consumption.

SUMMARY OF THE INVENTION

An object of the present invention is to propose a GOA circuit and a display using the GOA circuit for resolving the problem occurring in the conventional technology.

According to the present invention, a gate driver on array (GOA) circuit comprises a plurality of GOA circuit units coupled in cascade. Each of the plurality of GOA circuit units at each stage is used for outputting a scanning signal via an output terminal according to a scanning signal output by a GOA circuit unit at previous two stages, a scanning signal output by a GOA circuit unit at next two stages, a first clock signal, a second clock signal, a third clock signal, a fourth clock signal, a first enabling signal, and a second enabling signal. The GOA circuit units at every two stages share a pull-down circuit. The pull-down circuit comprises a first transistor, a second transistor and a third transistor. The first transistor comprises a gate electrically connected to the first enabling signal, a drain electrically connected to the first clock signal or the second clock signal. The second transistor comprises a gate electrically connected to the second enabling signal, a drain electrically connected to the second clock signal or the first clock signal. The third transistor comprises a gate electrically connected to a source of the first transistor and a source of the second transistor, and a drain electrically connected to a first constant voltage. Each of the plurality of GOA circuit units comprises an input control module, an output control module, and a pull-down holding module. The input control module electrically connected to a controlling node, is used for controlling a voltage imposed on the controlling node according to the first enabling signal, the second enabling signal, the scanning signal output by the GOA circuit unit at previous two stages, and the scanning signal output by the GOA circuit unit at next two stages. The output control module electrically connected to the controlling node, is used for outputting the scanning signal according to the voltage imposed on the controlling node. The pull-down holding module electrically connected to the input control module and the output control module, is used for holding the scanning signal at low voltage level.

In one aspect of the present invention, the input control module comprises a fourth transistor and a fifth transistor. The fourth transistor comprises a gate electrically connected to the scanning signal output by the GOA circuit unit at previous two stages, a drain electrically connected to the first enabling signal, and a source electrically connected to the controlling node. The fifth transistor comprises a gate electrically connected to the scanning signal output by the GOA circuit unit at next two stages, a drain electrically connected to the second enabling signal, and a source electrically connected to the controlling node.

In another aspect of the present invention, the output control module comprises a sixth transistor and a seventh transistor. The sixth transistor comprises a gate electrically connected to the first constant voltage, and a drain electrically connected to the controlling node. The seventh transistor comprises a gate electrically connected to a source of the sixth transistor, a drain electrically connected to the third clock signal or the fourth clock signal, and a source electrically connected to the output terminal.

In another aspect of the present invention, the pull-down holding module comprises: an eighth transistor, comprising a gate electrically connected to a source of the third transistor, a drain electrically connected to the controlling node, and a source electrically connected to a second constant voltage; a ninth transistor, comprising a gate electrically connected to the controlling node, a drain electrically connected to the source of the third transistor, and a source electrically connected to the second constant voltage; a tenth transistor, comprising a gate electrically connected to the source of the third transistor, a drain electrically connected to the output terminal, and a source electrically connected to the second constant voltage; and a capacitor, comprising two terminals connected to the gate of the ninth transistor and the second constant voltage, respectively.

In another aspect of the present invention, one of the GOA circuit units at every two stages comprises the seventh transistor comprising the drain electrically connected to the third clock signal, and the other one of the GOA circuit units at every two stages comprises the seventh transistor comprising the drain electrically connected to the fourth clock signal.

In another aspect of the present invention, each of the transistors is an N-type metal oxide semiconductor (NMOS) transistor. The first constant voltage is at high voltage level, and the second constant voltage is at low voltage level.

In still another aspect of the present invention, every four GOA circuit units form a GOA circuit unit set. The GOA circuit unit set comprises a first pull-down circuit and a second pull-down circuit, the first pull-down circuit comprises a first transistor comprising a gate and a drain electrically connected to the first enabling signal and the first clock signal, respectively, and comprises a second transistor comprising a gate and a drain electrically connected to the second enabling signal and the second clock signal, respectively. A first transistor of the second pull-down circuit comprises a gate and a drain electrically connected to the first enabling signal and the second clock signal, respectively, and A second transistor of the second pull-down circuit comprises a gate and a drain electrically connected to the second enabling signal and the first clock signal, respectively.

In yet another aspect of the present invention, timing of an output pulse of the first clock signal, timing of an output pulse of the second clock signal, timing of an output pulse of the third clock signal, and timing of an output pulse of the fourth clock signal never overlap with one another.

According to the present invention, a display comprises a source driver for outputting data signal to a plurality of pixel units to show images, and a gate driver on array (GOA) circuit, for outputting scan signal to turn a plurality of transistors.

Compared with the conventional technology, the GOA circuit units at every two stages share a pull-down circuit in this invention. It helps not only decrease the number of transistors for the GOA circuit but also lower the frequency of the first and second clock signals. The decrease in the frequency of the first and second clock signals helps a decrease in the frequency of charge and discharge to the parasitic capacitance and further a reduction in overall power consumption of the GOA circuit. In other words, the present invention has a beneficiary effect on power saving.

These and other features, aspects and advantages of the present disclosure will become understood with reference to the following description, appended claims and accompanying figures.

DETAILED DESCRIPTION OF THE PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
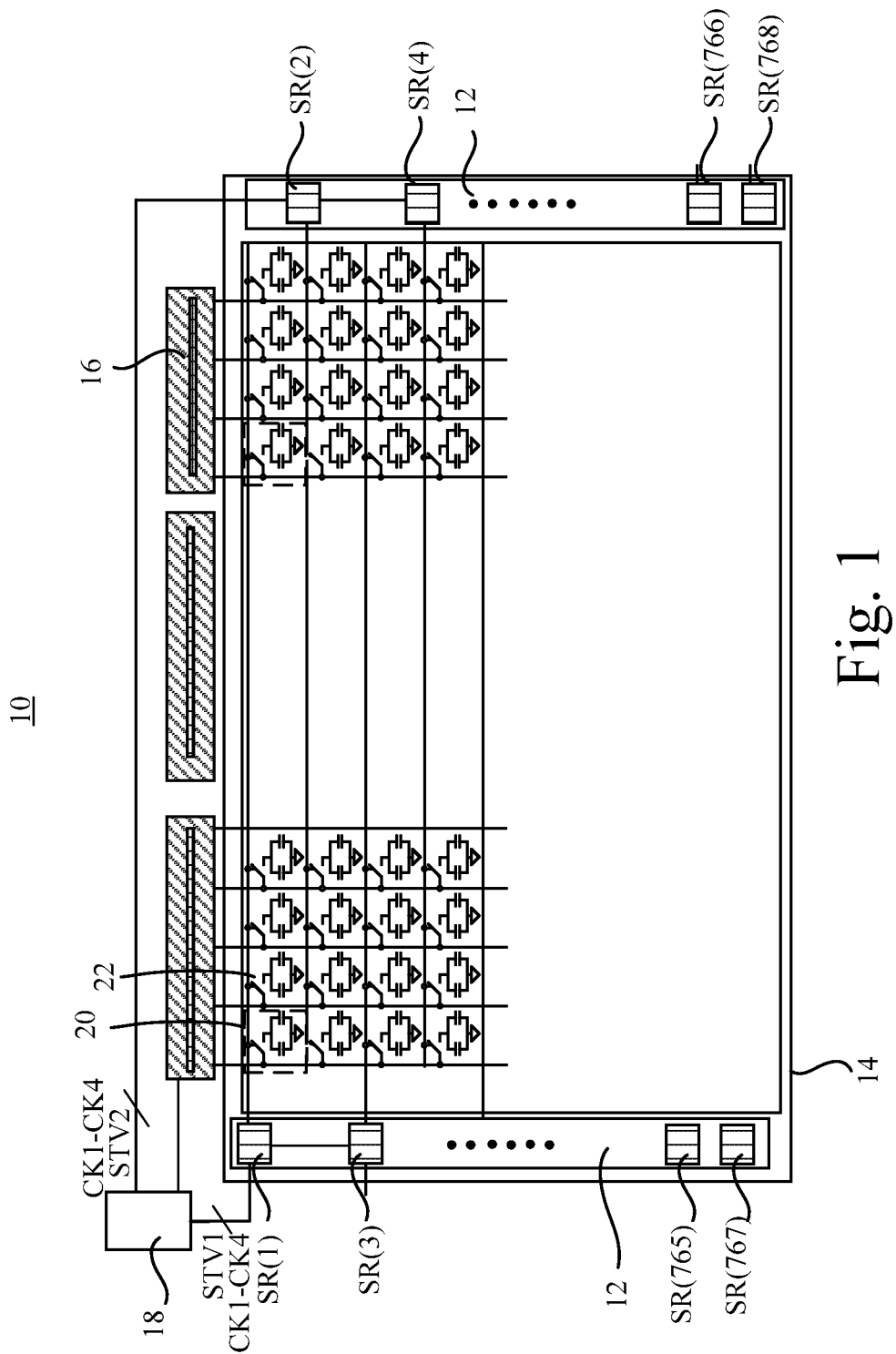
FIG. 1 is a schematic diagram showing a display adopting a GOA circuit according to a preferred embodiment of the present invention.

Please refer to FIG. 1. FIG. 1 is a schematic diagram showing a display 10 adopting a GOA circuit according to a preferred embodiment of the present invention. The display 10 may be a liquid crystal display (LCD) or an organic light emitting diode (OLED) display. The display 10 comprises a GOA circuit 12, a glass substrate 14, a source driver 16, and a controller 18. A plurality of pixels are arranged in a matrix on the glass substrate 14. A plurality of GOA circuits 12 are arranged in a matrix on the glass substrate 14 as well. Each of the plurality of pixels comprises three pixel units 20. The pixel units 20 represents primary colors, i.e., red (R), green (G), and blue (B), respectively. Take the LCD 10 with a resolution of 1024×768 for example. The LCD 10 comprises 1024×768×3 pixel units 20. The GOA circuit 12 outputs a scanning signal to turn on the transistors 22 in each row consecutively. Meanwhile, the source driver 16 outputs a corresponding data signal to the pixel units 20 in an entire column to charge the pixel units 20 to fulfillment. Different grayscales are shown afterwards. After the transistors 22 in each row finish being charged, the scanning signal in the row of the GOA circuits 12 is closed. Then, the GOA circuit 12 outputs a scanning signal to turn on the transistors 22 in the next row again. Subsequently, the source driver 16 charges and discharges the pixel units 20 in the next row. Step by step, after all of the pixel units 20 complete being charged, the pixel units 20 in the first row restart to be charged.

The GOA circuit 12 is disposed on each side of the glass substrate 14. The two GOA circuits 12 comprise a plurality of GOA circuit units SR(1), SR(3), ..., SR(767) and SR(2), SR(4), ..., SR(768), respectively. The GOA circuit units SR(1)~SR(768) are connected to a plurality of rows of pixel units 20 one-on-one. That is, the two GOA circuits 12 are used for controlling the plurality of pixel units 20 in odd rows and the plurality of pixel units 20 in even rows, respectively. The clock signals CK1~CK4 generated by the controller 18 and the GOA enabling signals STV1, STV2 are transmitted to the GOA circuit units SR(1)~SR(768), and then the GOA circuit units SR(1)~SR(768) generate scanning signals to the plurality of pixel units 20.

Figure 2:
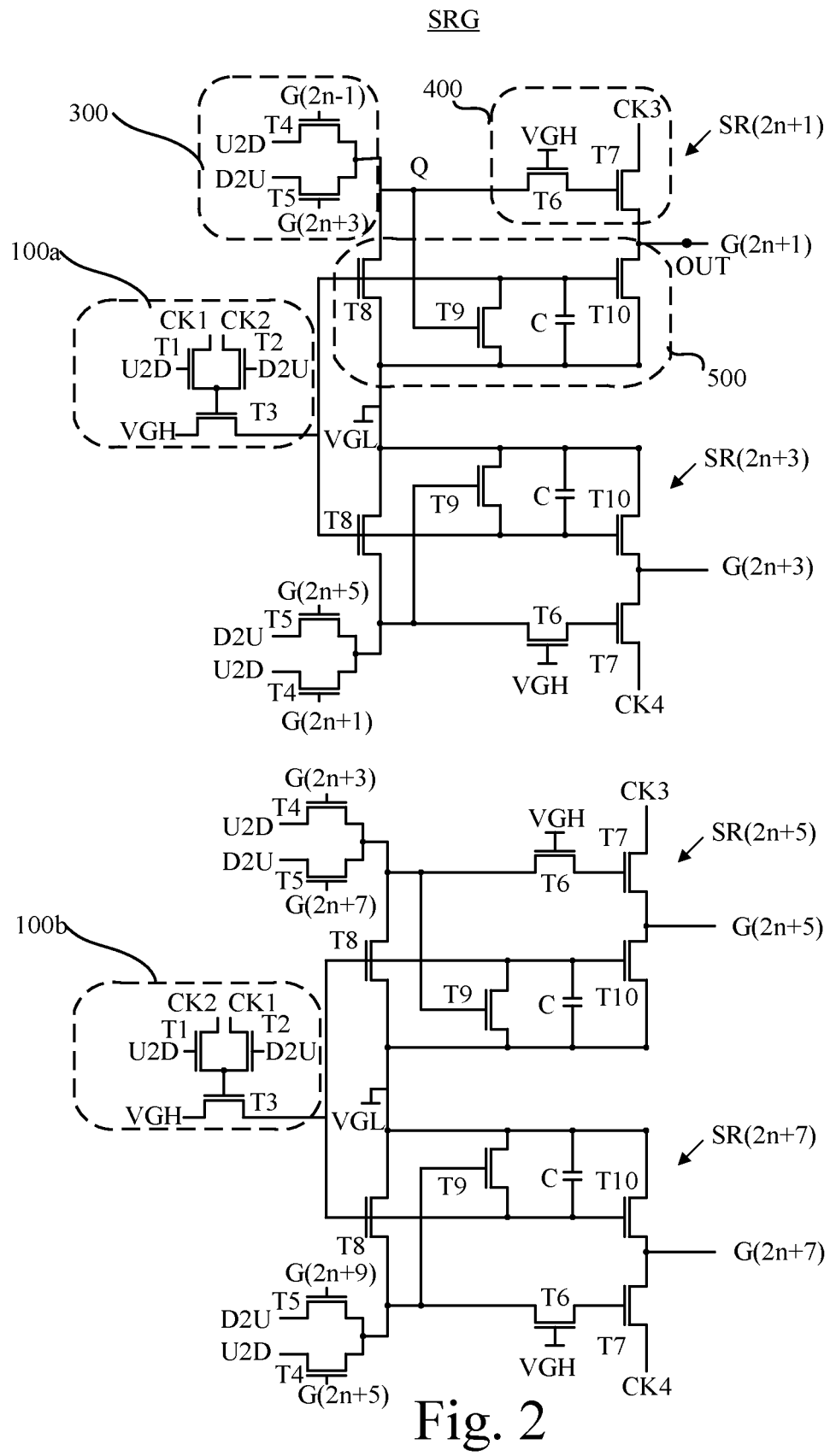
FIG. 2 is a circuit diagram of a GOA circuit unit according to the preferred embodiment of the present invention.

Please refer to FIG. 2. FIG. 2 is a circuit diagram of a GOA circuit unit SR(n) according to the preferred embodiment of the present invention. Every four GOA circuit units SR(2n+1), SR(2n+3), SR(2n+5), and SR(2n+7) form a GOA circuit unit set SRG. The GOA circuit unit SR(2n+1) outputs the scanning signal G(2n+1) via the output terminal OUT according to a scanning signal G(2n−1) output by the GOA circuit unit SR(2n−1) at previous two stages, a scanning signal G(2n+3) output by the GOA circuit unit SR(2n+3) at next two stages, a first clock signal CK1, a second clock signal CK2, a third clock signal CK3, a fourth clock signal CK4, a first enabling signal U2D, and a second enabling signal D2U. The GOA circuit units SR(2n+1) and SR(2n+3) at two adjoining stages share a first pull-down circuit 100a. The GOA circuit units SR(2n+5) and SR(2n+7) at two adjoining stages share a second pull-down circuit 100b. The timing of an output pulse of the first clock signal CKV1, the timing of an output pulse of the second clock signal CKV2, the timing of an output pulse of the third clock signal CKV3, and the timing of an output pulse of the fourth clock signal CKV4 never overlap with one another.

The pull-down circuit 100a comprises a first transistor T1, a second transistor T2, and a third transistor T3. A gate of the first transistor T1 is electrically connected to the first enabling signal U2D. A drain of the first transistor T1 is electrically connected to the first clock signal CK1. A gate of the second transistor T2 is electrically connected to the second enabling signal D2U. A drain of the second transistor T2 is electrically connected to the second clock signal CK2. A gate of a third transistor T3 is electrically connected to a source of the first transistor T1 and a source of the second transistor T2. A drain of the third transistor T3 is electrically connected to a first constant voltage VGH. The second pull-down circuit 100b comprises a first transistor T1 comprising a gate electrically connected to the first enabling signal U2D and a drain electrically connected to the second clock signal CK2. The second pull-down circuit 100b comprises a second transistor T2 comprising a gate electrically connected to the second enabling signal D2U and a drain electrically connected to the first clock signal CK1. The second pull-down circuit 100b comprises a third transistor T3 comprising a gate electrically connected to a source of the first transistor T1 and a source of the second transistor T2, and a drain electrically connected to the first constant voltage VGH.

Since the structure of the GOA circuit unit at each stage is identical, the GOA circuit unit SR(2n+1) is exemplified in this embodiment. The GOA circuit unit SR(2n+1) comprises an input control module 300, an output control module 400, and a pull-down holding module 500. The input control module 300 is electrically connected to a controlling node Q and used for controlling a voltage imposed on the controlling node Q according to the first enabling signal U2D, the second enabling signal D2U, the scanning signal G(2n−1) output by the GOA circuit unit SR(2n−1) at previous two stages, and the scanning signal G(2n+3) output by the GOA circuit unit SR(2n+3) at next two stages. The input control module 300 comprises a fourth transistor T4 and a fifth transistor T5. A gate of the fourth transistor T4 is electrically connected to the scanning signal G(2n−1) output by the GOA circuit unit SR(2n−1) at previous two stages. A drain of the fourth transistor T4 is electrically connected to the first enabling signal U2D. A source of the fourth transistor T4 is electrically connected to the controlling node Q. A gate of the fifth transistor T5 is electrically connected to the scanning signal G(2n+3) output by the GOA circuit unit SR(2n+3) at next two stages. A drain of the fifth transistor T5 is electrically connected to the second enabling signal D2U. A source of the fifth transistor T5 is electrically connected to the controlling node Q.

The output control module 400 is electrically connected to the controlling node Q and used for outputting the scanning signal G(2n+1) according to the voltage imposed on the controlling node Q. The output control module 400 comprises a sixth transistor T6 and a seventh transistor T7. A gate of the sixth transistor T6 is electrically connected to the first constant voltage VGH. A drain of the sixth transistor T6 is electrically connected to the controlling node Q. A gate of the seventh transistor T7 is electrically connected to a source of the sixth transistor T6. A drain of the seventh transistor T7 is electrically connected to the third clock signal CK3. A source of the seventh transistor T7 is electrically connected to the output terminal OUT. It is notified that the gate of the seventh transistor T7 in the GOA circuit unit SR(2n+3) is electrically connected to the source of the sixth transistor T6, and the drain of the seventh transistor T7 is electrically connected to the fourth clock signal CK4.

The pull-down holding module 500 is electrically connected to the input control module 300 and the output control module 400 and used for holding the scanning signal G(2n+1) at low voltage level. The pull-down holding module 500 comprises an eighth transistor T8, a ninth transistor T9, a tenth transistor T10, and a capacitor C. A gate of the eighth transistor T8 is electrically connected to a source of the third transistor T3. A drain of the eighth transistor T8 is electrically connected to the controlling node Q. A source of the eighth transistor T8 is electrically connected to the second constant voltage VGL. A gate of the ninth transistor T9 is electrically connected to the controlling node Q. A drain of the ninth transistor T9 is electrically connected to the source of the third transistor T3. A source of the ninth transistor T9 is electrically connected to the second constant voltage VGL. A gate of the tenth transistor T10 is electrically connected to the source of the third transistor T3. A drain of the tenth transistor T10 is electrically connected to the output terminal OUT. A source of the tenth transistor T10 is electrically connected to the second constant voltage VGL. Two terminals of the capacitor C are connected to the gate of the ninth transistor T9 and the second constant voltage VGL, respectively.

Each of the transistors in this embodiment is an N-type metal oxide semiconductor (NMOS) transistor as shown in FIG. 2. The first constant voltage VGH is at high voltage level. The second constant voltage VGL is at low voltage level.

Figure 3:
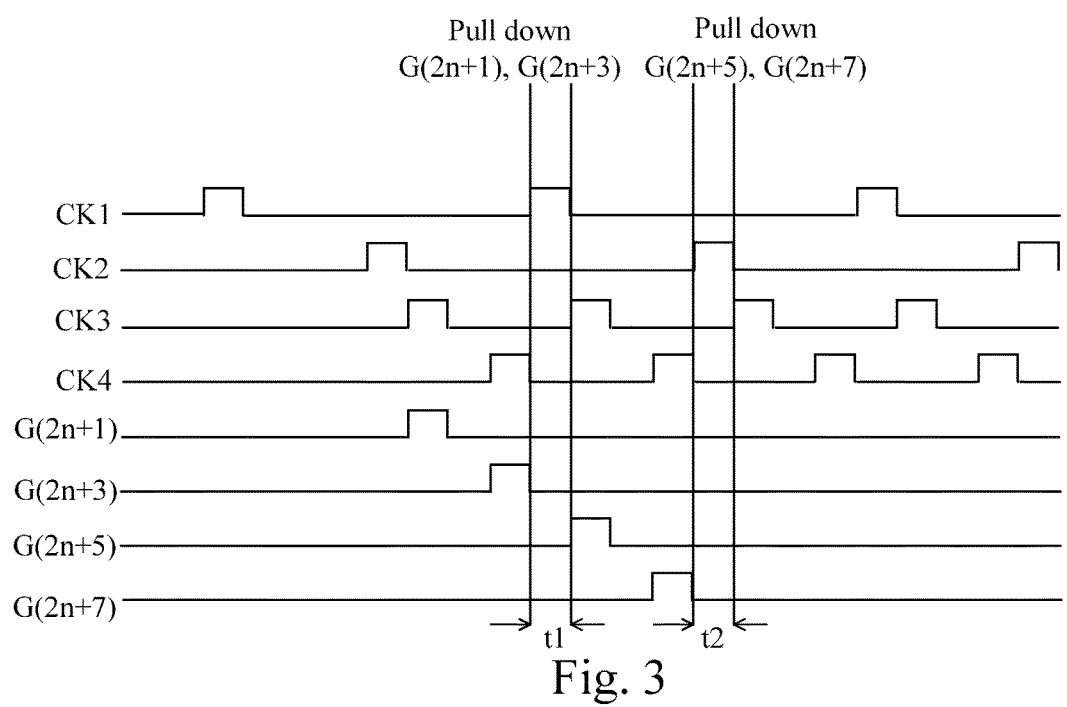
FIG. 3 is a timing diagram of an input signal and an output signal of the GOA circuit unit set.

Please refer to FIG. 3. FIG. 3 is a timing diagram of an input signal and an output signal of the GOA circuit unit set. With respect to the GOA circuit units SR(2n+1) and SR(2n+3), the first clock signal CK1 and the first enabling signal U2D are at high voltage level during the period of t1, and the first transistor T1 conducts the first clock signal CK1 at high voltage level. In the meantime, the gate of the third transistor T3 conducts the first constant voltage VGH at high voltage level because of the first clock signal CK1 at high voltage level, and the gate of the tenth transistor T10 conducts the second constant voltage VGL at low voltage level because of the first constant voltage VGH at high voltage level. Thus, the scanning signals G(2n+1) and G(2n+3) output by the GOA circuit units SR(2n+1) and SR(2n+3) are pulled down as scanning signals at low voltage level.

With respect to the GOA circuit units SR(2n+5) and SR(2n+7), the second clock signal CK2 and the first enabling signal U2D are at high voltage level during the period of t2, and the first transistor T1 conducts the second clock signal CK2 at high voltage level. In the meantime, the gate of the third transistor T3 conducts the first constant voltage VGH at high voltage level because of the second clock signal CK2 at high voltage level, and the gate of the tenth transistor T10 conducts the second constant voltage VGL at low voltage level because of the first constant voltage VGH at high voltage level. Thus, the scanning signals G(2n+5) and G(2n+7) output by the GOA circuit units SR(2n+5) and SR(2n+7) are pulled down as scanning signals at low voltage level.

Based on the embodiment as introduced above, the GOA circuit units at every two stages share a pull-down circuit. For example, the adjacent GOA circuit units SR(2n+1), SR(2n+3) share the first pull-down circuit 100*a*, and the adjacent GOA circuit units SR(2n+5), SR(2n+7) share the second pull-down circuit 100*b*. In contrast to each conventional GOA circuit unit having a pull-down module, the structure of the present invention helps not only decrease the number of transistors for the GOA circuit 12 but also lower the frequency of the first and second clock signals CK1 and CK2. The decrease in the frequency of the first and second clock signals CK1 and CK2 helps a decrease in the frequency of charge and discharge to the parasitic capacitance and further a reduction in overall power consumption of the GOA circuit 12. In other words, the present invention has a beneficiary effect on power saving.

Each of the transistors in this embodiment is an NMOS transistor as described above. But it is only an example for demonstration. The people skilled in the art are able to fabricate a GOA circuit unit comprising all P-type metal-oxide-semiconductor (PMOS) transistors or a GOA circuit unit comprising some NMOS transistors and some PMOS transistors based on the circuit proposed by the present invention. The GOA circuit unit with the same function as mentioned above can be also fabricated. No further details are described in this specification.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A gate driver on array (GOA) circuit, comprising:
a plurality of GOA circuit units, coupled in cascade, each of the plurality of GOA circuit units at each stage for outputting a scanning signal via an output terminal according to a scanning signal output by a GOA circuit unit at previous two stages, a scanning signal output by a GOA circuit unit at next two stages, a first clock signal, a second clock signal, a third clock signal, a fourth clock signal, a first enabling signal, and a second enabling signal, wherein the GOA circuit units at every two stages share a pull-down circuit, and the pull-down circuit comprises:
a first transistor, comprising a gate electrically connected to the first enabling signal, a drain electrically connected to the first clock signal or the second clock signal;
a second transistor, comprising a gate electrically connected to the second enabling signal, a drain electrically connected to the second clock signal or the first clock signal; and
a third transistor, comprising a gate electrically connected to a source of the first transistor and a source of the second transistor, and a drain electrically connected to a first constant voltage;
each of the plurality of GOA circuit units comprising:
an input control module, electrically connected to a controlling node, for controlling a voltage imposed on the controlling node according to the first enabling signal, the second enabling signal, the scanning signal output by the GOA circuit unit at previous two stages, and the scanning signal output by the GOA circuit unit at next two stages;
an output control module, electrically connected to the controlling node, for outputting the scanning signal according to the voltage imposed on the controlling node; and
a pull-down holding module, electrically connected to the input control module and the output control module, for holding the scanning signal at low voltage level.

2. The GOA circuit of claim 1, wherein the input control module comprises:
a fourth transistor, comprising a gate electrically connected to the scanning signal output by the GOA circuit unit at previous two stages, a drain electrically connected to the first enabling signal, and a source electrically connected to the controlling node; and
a fifth transistor, comprising a gate electrically connected to the scanning signal output by the GOA circuit unit at next two stages, a drain electrically connected to the second enabling signal, and a source electrically connected to the controlling node.

3. The GOA circuit of claim 2, wherein the output control module comprises:
a sixth transistor, comprising a gate electrically connected to the first constant voltage, and a drain electrically connected to the controlling node; and
a seventh transistor, comprising a gate electrically connected to a source of the sixth transistor, a drain electrically connected to the third clock signal or the fourth clock signal, and a source electrically connected to the output terminal.

4. The GOA circuit of claim 3, wherein the pull-down holding module comprises:
an eighth transistor, comprising a gate electrically connected to a source of the third transistor, a drain electrically connected to the controlling node, and a source electrically connected to a second constant voltage;
a ninth transistor, comprising a gate electrically connected to the controlling node, a drain electrically connected to the source of the third transistor, and a source electrically connected to the second constant voltage;
a tenth transistor, comprising a gate electrically connected to the source of the third transistor, a drain electrically connected to the output terminal, and a source electrically connected to the second constant voltage; and
a capacitor, comprising two terminals connected to the gate of the ninth transistor and the second constant voltage, respectively.

5. The GOA circuit of claim 3, wherein one of the GOA circuit units at every two stages comprises the seventh transistor comprising the drain electrically connected to the third clock signal, and the other one of the GOA circuit units at every two stages comprises the seventh transistor comprising the drain electrically connected to the fourth clock signal.

6. The GOA circuit of claim 5, wherein each of the transistors is an N-type metal oxide semiconductor (NMOS) transistor, the first constant voltage is at high voltage level, and the second constant voltage is at low voltage level.

7. The GOA circuit of claim 1, wherein every four GOA circuit units form a GOA circuit unit set, the GOA circuit unit set comprises a first pull-down circuit and a second pull-down circuit, the first pull-down circuit comprises a first transistor comprising a gate and a drain electrically connected to the first enabling signal and the first clock signal, respectively, and comprises a second transistor comprising a gate and a drain electrically connected to the second enabling signal and the second clock signal, respectively;
a first transistor of the second pull-down circuit comprises a gate and a drain electrically connected to the first enabling signal and the second clock signal, respectively, and a second transistor of the second pull-down circuit comprises a gate and a drain electrically connected to the second enabling signal and the first clock signal, respectively.

8. The GOA circuit of claim 1, wherein timing of an output pulse of the first clock signal, timing of an output pulse of the second clock signal, timing of an output pulse of the third clock signal, and timing of an output pulse of the fourth clock signal never overlap with one another.

9. A display comprising:
a source driver, for outputting data signal to a plurality of pixel units to show images; and
a gate driver on array (GOA) circuit, for outputting scan signal to turn a plurality of transistors, the GOA circuit comprising:
a plurality of GOA circuit units, coupled in cascade, each of the plurality of GOA circuit units at each stage for outputting a scanning signal via an output terminal according to a scanning signal output by a GOA circuit unit at previous two stages, a scanning signal output by a GOA circuit unit at next two stages, a first clock signal, a second clock signal, a third clock signal, a fourth clock signal, a first enabling signal, and a second enabling signal, wherein the GOA circuit units at every two stages share a pull-down circuit, and the pull-down circuit comprises:

a first transistor, comprising a gate electrically connected to the first enabling signal, a drain electrically connected to the first clock signal or the second clock signal;

a second transistor, comprising a gate electrically connected to the second enabling signal, a drain electrically connected to the second clock signal or the first clock signal; and a third transistor, comprising a gate electrically connected to a source of the first transistor and a source of the second transistor, and a drain electrically connected to a first constant voltage;

each of the plurality of GOA circuit units comprising:

an input control module, electrically connected to a controlling node, for controlling a voltage imposed on the controlling node according to the first enabling signal, the second enabling signal, the scanning signal output by the GOA circuit unit at previous two stages, and the scanning signal output by the GOA circuit unit at next two stages;

an output control module, electrically connected to the controlling node, for outputting the scanning signal according to the voltage imposed on the controlling node; and a pull-down holding module, electrically connected to the input control module and the output control module, for holding the scanning signal at low voltage level.

10. The display of claim 9, wherein the input control module comprises:

a fourth transistor, comprising a gate electrically connected to the scanning signal output by the GOA circuit unit at previous two stages, a drain electrically connected to the first enabling signal, and a source electrically connected to the controlling node; and a fifth transistor, comprising a gate electrically connected to the scanning signal output by the GOA circuit unit at next two stages, a drain electrically connected to the second enabling signal, and a source electrically connected to the controlling node.

11. The display of claim 10, wherein the output control module comprises:

a sixth transistor, comprising a gate electrically connected to the first constant voltage, and a drain electrically connected to the controlling node; and a seventh transistor, comprising a gate electrically connected to a source of the sixth transistor, a drain electrically connected to the third clock signal or the fourth clock signal, and a source electrically connected to the output terminal.

12. The display of claim 11, wherein the pull-down holding module comprises:

an eighth transistor, comprising a gate electrically connected to a source of the third transistor, a drain electrically connected to the controlling node, and a source electrically connected to a second constant voltage;

a ninth transistor, comprising a gate electrically connected to the controlling node, a drain electrically connected to the source of the third transistor, and a source electrically connected to the second constant voltage;

a tenth transistor, comprising a gate electrically connected to the source of the third transistor, a drain electrically connected to the output terminal, and a source electrically connected to the second constant voltage; and a capacitor, comprising two terminals connected to the gate of the ninth transistor and the second constant voltage, respectively.

13. The display of claim 11, wherein one of the GOA circuit units at every two stages comprises the seventh transistor comprising the drain electrically connected to the third clock signal, and the other one of the GOA circuit units at every two stages comprises the seventh transistor comprising the drain electrically connected to the fourth clock signal.

14. The display of claim 13, wherein each of the transistors is an N-type metal oxide semiconductor (NMOS) transistor, the first constant voltage is at high voltage level, and the second constant voltage is at low voltage level.

15. The display of claim 9, wherein every four GOA circuit units form a GOA circuit unit set, the GOA circuit unit set comprises a first pull-down circuit and a second pull-down circuit, the first pull-down circuit comprises a first transistor comprising a gate and a drain electrically connected to the first enabling signal and the first clock signal, respectively, and comprises a second transistor comprising a gate and a drain electrically connected to the second enabling signal and the second clock signal, respectively;

a first transistor of the second pull-down circuit comprises a gate and a drain electrically connected to the first enabling signal and the second clock signal, respectively, and a second transistor of the second pull-down circuit comprises a gate and a drain electrically connected to the second enabling signal and the first clock signal, respectively.

16. The display of claim 9, wherein timing of an output pulse of the first clock signal, timing of an output pulse of the second clock signal, timing of an output pulse of the third clock signal, and timing of an output pulse of the fourth clock signal never overlap with one another.

* * * * *